(12) United States Patent
Lin

(10) Patent No.: US 6,465,822 B2
(45) Date of Patent: Oct. 15, 2002

(54) SEMICONDUCTOR DEVICE HAVING A REDUCED-CAPACITANCE CONDUCTIVE LAYER AND FABRICATION METHOD FOR THE SAME

(75) Inventor: Hsiao-Ming Lin, Taoyuan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/878,598

(22) Filed: Jun. 11, 2001

(65) Prior Publication Data

US 2002/0137277 A1 Sep. 26, 2002

(30) Foreign Application Priority Data

Feb. 7, 2001 (TW) .......................................... 090102583

(51) Int. Cl.$^7$ ............................................. H01L 27/148
(52) U.S. Cl. ...................... 257/243; 357/23.6; 257/374; 438/203; 438/218; 438/223
(58) Field of Search .......................... 357/236; 257/374; 438/218, 207, 223

(56) References Cited

U.S. PATENT DOCUMENTS

| | | | | |
|---|---|---|---|---|
| 4,511,911 A | * | 4/1985 | Kenny | 357/23.6 |
| 5,306,940 A | * | 4/1994 | Yamazaki | 257/374 |
| 5,405,790 A | * | 4/1995 | Rahim et al. | 438/218 |
| 5,407,841 A | * | 4/1995 | Liao et al. | 438/207 |
| 5,811,315 A | * | 9/1998 | Yindeepol et al. | 438/223 |
| 6,271,070 B2 | * | 8/2001 | Kotani et al. | 438/207 |

* cited by examiner

Primary Examiner—David Nelms
Assistant Examiner—Mai-Huong Tran
(74) Attorney, Agent, or Firm—J.C. Patents

(57) ABSTRACT

A method of reducing the capacitance of a conductive layer and a semiconductor obtained thereby. In the method, a well region is formed below the isolation, adjacent to it, an in a floating form. The well region has a dopant type different than the dopant type of the substrate. A depletion region can be formed at the interface between the floating well and the substrate. By connecting the capacitance of the depletion region and the parasitic capacitance generated between the conductive layer and the floating well in series, the total parasitic capacitance of the conductive layer can be reduced so as to increase the operational speed of the device.

23 Claims, 2 Drawing Sheets

SEMICONDUCTOR DEVICE HAVING A REDUCED-CAPACITANCE CONDUCTIVE LAYER AND FABRICATION METHOD FOR THE SAME

CROSS-REFERENCE TO RELATED APPLICATION

This application claims the priority benefit of Taiwan application serial no. 090102583, filed Feb. 7, 2001.

BACKGROUND OF THE INVENTION

1. Field of the Invention

The present invention relates to a semiconductor device and a fabrication method thereof. Specifically, the present invention relates to a method of reducing the capacitance of a conductive layer and a semiconductor device obtained thereby.

2. Description of the Related Art

The increase in operational speed of a semiconductor device is an essential point in the development of the semiconductor industry and also is an important consideration for consumers when purchasing semiconductor devices. With the rapid development of the semiconductor circuit, the resistance of a conductive layer and the parasitic capacitance between the conductive layers have been critical factors among various factors that affect the operational speed.

Currently, a metal material having low resistance has been developed in order to reduce the resistance of the conductive layer. Improving the parasitic capacitance between conductive layers is achieved by using a material having a low dielectric constant instead of a conventional silicon dioxide as a dielectric layer between multi-layer metal connections.

However, the metal material and the dielectric layer having a low dielectric constant must be selected depending on the properties of the material and the process to be carried out. Therefore, the selection of the material is limited.

SUMMARY OF THE INVENTION

The present invention provides a method of reducing the capacitance of a conductive layer. The method is based on the existing process conditions, rather than selecting of a special material, to reduce the capacitance, of a conductive layer and increase the transmission speed.

That present invention provides a method of reducing the capacitance of a conductive layer, in which a well region is formed below and adjacent to an isolation and in a floating form.

According to one preferred embodiment, the above-mentioned method can be used in a process for fabricating a semiconductor device in which a conductive layer is formed a dielectric layer above an isolation. The above-mentioned method also can be used in a process for fabricating a semiconductor in which a local interconnection is formed on an isolation.

In the above-mentioned well region, the well region is a single well having a dopant type different than the doping type of the substrate. When the substrate has P type dopants, the well region has N type dopants; when the substrate has N type dopants, the well region has P type dopants.

A multi-well can be included in the well region. The multi-well comprises at least a first well region and a second well region, with the first well region being adjacent to the substrate and including the second well region therein, and the first well region having a different dopant type from the substrate and the second well region. When the dopant type of the substrate is P type, the dopant type of the well region is N type and that of the second well region is P type. When the dopant type of the substrate is N type, the dopant type of the well region is P type and that of the second well region is N type. floating well is not only formed below the isolation, but also adjacent to it. A depletion region can be formed at the interface between the floating well and the substrate. By connecting capacitance of the depletion region and the parasitic capacitance generated between the conductive layer and the floating well in series, the total parasitic capacitance of the conductive layer can be reduced so as to increase the operational speed of the device.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1:
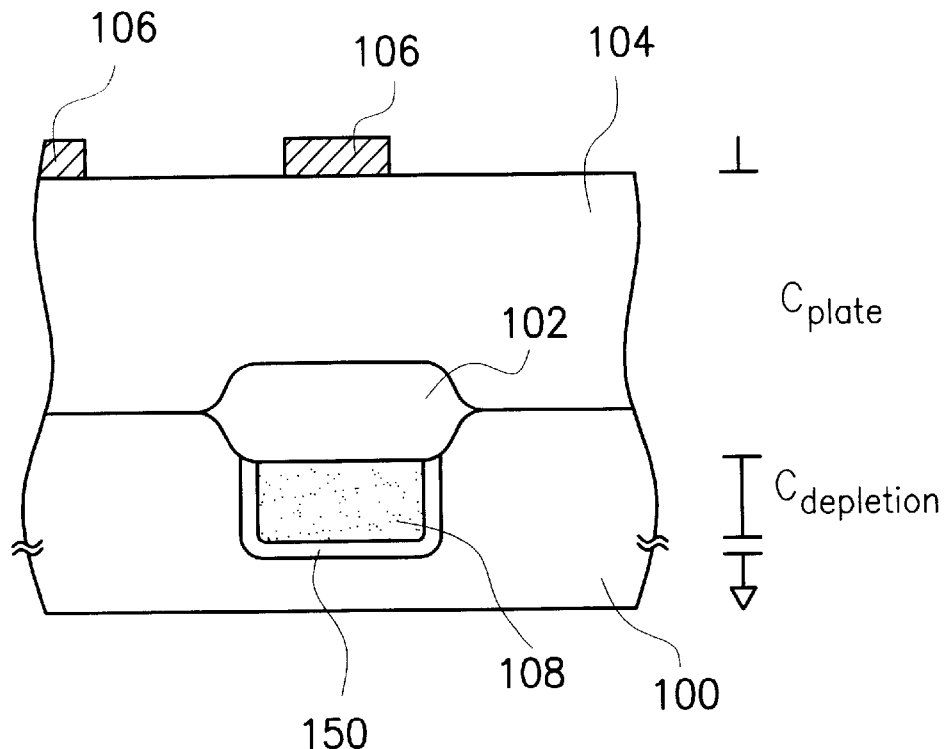
FIGS. 1–4 are schematic cross-sectional views of a semiconductor device having reduced capacitance.

Reference will now be made in detail to the present preferred embodiments of the invention, examples of which are illustrated in the accompanying drawings. Whenever possible, the same reference numbers are used in the drawings and the description to refer to the same or like parts.

FIG. 1 is a schematic cross sectional view of a semiconductor device having a reduced capacitance according to a preferred embodiment of the present invention.

With reference to FIG. 1, an isolation 102 is formed in the substrate 100 to define an active region of the substrate. Then, a device (not shown), such as a field effect transistor or a dipolar transistor, is formed on the active region as desired. A dielectric layer 104 is formed over the substrate, and a conductive layer 106 is formed on the dielectric layer 104 to form a metal interconnection.

In the invention, a well region 108 is formed under the isolation 102 where the conductive layer 106 is to be formed thereunder. The well region 108 is adjacent to the isolation 102 and is in a floating form. The well region 108 can be a single well as shown in FIG. 1, or a multi-well as shown in FIG. 2, for example.

With reference to FIG. 1, the single well 108 has different type dopants from the substrate 100. When the doped type of the substrate 100 is P type, the doped type of the single well 108 is N type. When the doped type of the substrate 100 is N type, the doped type of the single well 108 is P type. A depletion region 150 is formed at the interface between the well region 108 and the substrate 100. The capacitance of the depletion region 150 can be connected in series to a parasitic capacitance which is formed between the conductive layer 106 and the floating well 108 on the isolation 102 to reduce the parasitic capacitance and increase the operational speed of the device.

Figure 2:
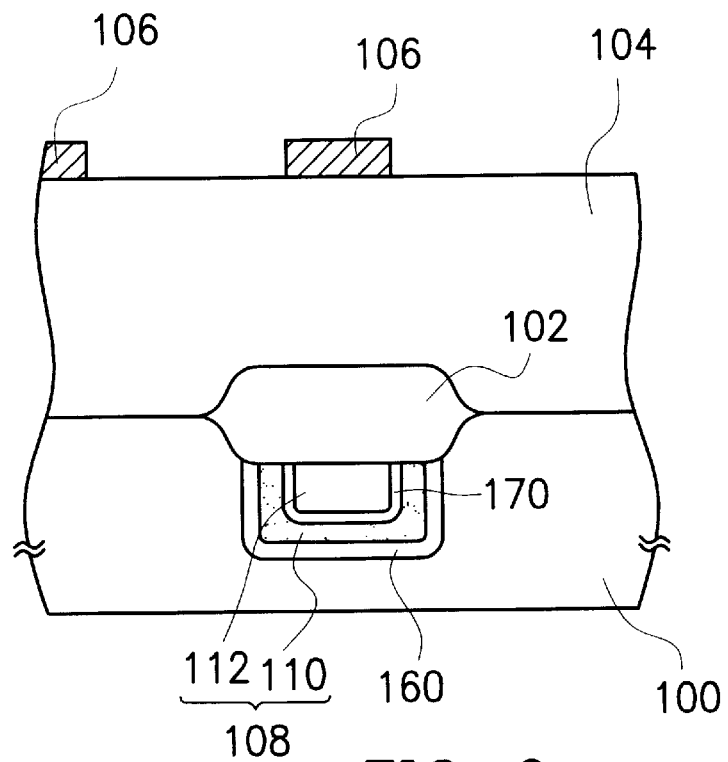

With reference to FIG. 2, the multi-well 108 consists of well regions 110 and 112. However, more than two well regions can be also used in the invention, depending on the actual demand. In the multi-well 108, the well region 110 is adjacent to the substrate 100 and has a different dopant type than the dopant type of the substrate. The well region 112 is located in the well region 110 and has a different dopant type than the dopant type of the well region 110. When the dopant type of the substrate is P, the dopant type of the well region 110 is N type and that of the well region 112 is P type. When the dopant type of the substrate is N, the dopant type of the well region 110 is P type and that of the well region 112 is N type A depletion region 160 is formed at the interface between the well region 110 and the substrate 100. A depletion region 170 is formed at the interface between the well regions 110 and 112. The capacitance of the depletion regions 160 and 170 can be connected in series to the capacitance formed between the conductive layer 106 and the floating well 108 on the isolation 102, resulting in reduced capacitance and increased operational speed of the device.

The well region 108 of the present invention is formed under the isolation 102. Forming the isolation 102 can be achieved by any conventional process, such as LOCOS or shallow trench isolation. In other words, the well region 108 of the present invention can be formed under the isolation 102, which is formed by LOCOS or shallow trench isolation.

Figure 3:
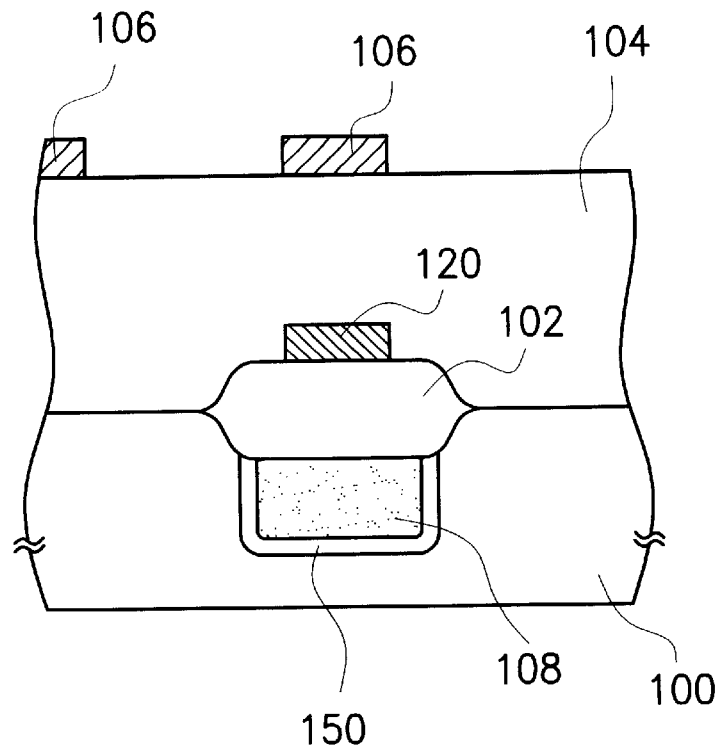
Figure 4:
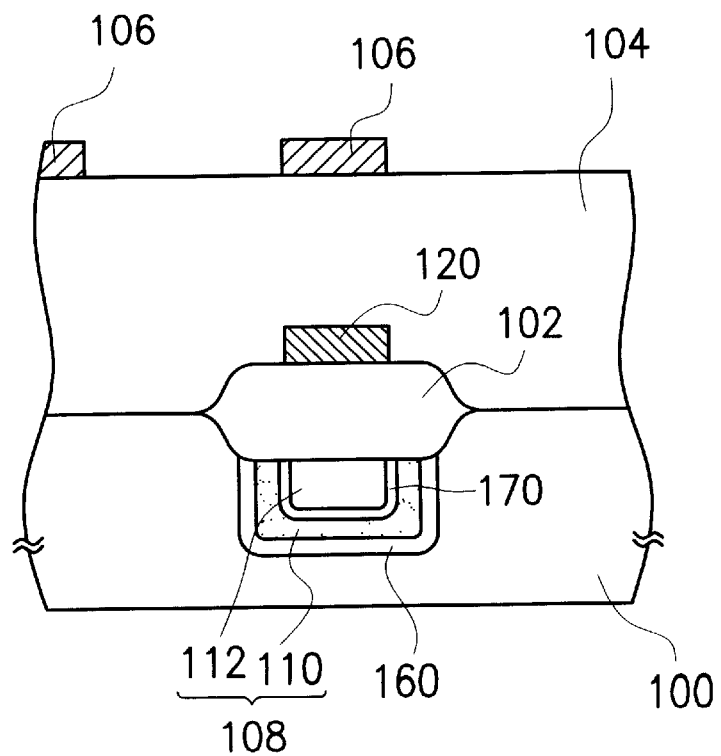

The process of the present invention can be applied not only in the case that the conductive layer 106 is formed on the dielectric layer 104 on the isolation 102 as shown in FIG. 3, but also in the case that a local interconnection 120 is formed on the isolation 102 as shown in FIG. 4.

With reference to FIG. 1, the capacitance of the conductive layer results from a Cplate generated by coupling the conductive layer 106 and the substrate 100 and a Cwire generated by coupling the conductive layers 106. The distance between the conductive layers can be adjusted and changed through the layout, while the distance between the conductive layer and the substrate 100 can not be changed as desired. Therefore, the parasitic capacitance Cplate generated by coupling the conductive layer 106 and the substrate 100 greatly influences the capacitance quantity of the whole conductive layer.

According to the present invention, the well region 108 is formed under the isolation 102, such that the depletion region 150 is formed at the interface between the well region 108 and the substrate 100. The capacitance Cdepletion of the depletion region 150 can be connected in series to the capacitance Cplate which is located between the conductive layer 106 formed on the isolation 102 and the floating well 108. After the capacitance Cdepletion and the capacitance Cplate are connected in series, the total capacitance Ctotal can be represented by the following equation:

Ctotal=1/[(1/Cplate )+(Cdepletion)]

In the case of a P type substrate 100 having dopant concentration of $1\times10^{16}/cm^3$ and a N type single well having dopant concentration of $1\times10^{18}/cm^3$, the capacitance Cdepletion can be obtained from:

$C_{depletion}=\{[e \times E_{si} \times E_0 \times N_a \times N_d]/[2\times(V_{bi}+V_{reverse})\times(N_a+N_b)]\}^{1/2}$ Wherein
  e: Electron Charge=$1.6\times10^{-19}$ Coulomb
  $E_{si}$: Relative Permittivity of Si=11.7
  $E_0$: Permittivity of Free Space
  $E_0$=$8.85\times10^{-14}$F/cm $N_a$: dopant concentration of the substrate=$1\times10^{16}/Cm^3$
$N_d$: dopant concentration of the well region=$1\times10^{18}/cm^3$
$V_{bi}$: Built-in Potential $$V_{bi} = (kT/e) \times \ln[(N_a \times N_d)/(N_i \times N_l)]$$
$$= (0.026) \times \ln[(1\times10^{16} \times 1\times10^{18})/(1.5\times10^{10})^2]$$
$$= 0.187 \text{ V}$$

$V_{reverse}$: reverse bias
When $V_{reverse}$=0, $$C_{depletion} = \{[e \times E_{si} \times E_o \times N_a \times N_d]/[2\times(V_{bi}+0)\times(N_a+N_b)]\}^{1/2}$$
$$= \{[(1.6\times10^{-19})\times(11.7)\times(8.85\times10^{-14})\times(1\times10^{18})\times$$
$$(1\times10^{16})]/[2\times0.817\times(1\times10^{16}+1\times10^{18})]\}^{1/2}$$
$$= 32\times10^{-9} \text{ F/cm}^2$$

When $V_{reverse}$>0,
$C_{depletion}$<$32\times10^{-9}$ F/cm$^2$
$C_{plate}$=$(E_{sio2}\times E_0)/d$
wherein
  $E_{sio2}$: relative dielectric constant of silicon oxide=3.9
  d: distance from the interface between the conductive layer and the dielectric layer to the interface between the isolation and well region $$C_{plate} = (E_{sio2} \times E_0)/d$$
$$= (3.9\times8.5\times10^{-14})/(7.5\times10^{-5})$$
$$= 4.6\times10^{-9} \text{ F/cm}^2$$
$$C_{total} = 1/[(1/C_{plate})+(1/C_{depletion})]$$
$$= 0.42\times10^{-9} \text{ F/cm}^2$$
$$= 0.87 C_{plate}$$

From the discussion above, the capacitance Cdepletion generated between the well region under the isolation and the substrate is larger than the capacitance Cplate generated between the conductive layer and the substrate by a factor of 10, thereby reducing the total parasitic capacitance of the conductive layer by 10% or more. If the capacitance Cdepletion is substantially equal to the capacitance Cplate, the total parasitic capacitance can be further reduced. The capacitance Cdepletion can be reduced by decreasing the dopant concentration of the substrate.

In summary, a floating well is not only formed below the isolation, but also adjacent to it. A depletion region can be formed at the interface between the floating well and the substrate. By connecting the capacitance of the depletion region and the parasitic capacitance generated between the conductive layer and the floating well in series, the total parasitic capacitance of the conductive layer can be reduced to increase the operational speed of a device.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A method of reducing the capacitance of a conductive layer, comprising:

providing a substrate having an isolation, wherein a dielectric layer is formed on the substrate and a conductive layer is formed on the dielectric layer; and forming a well region below and adjacent to the isolation of the substrate, wherein the well region has a different type of dopant than a dopant type of the substrate and is in a floating form.

2. The method of claim 1, further comprising forming a local interconnection on the isolation.

3. The method of claim 2, wherein the substrate has P type dopants and the well region has N type dopants.

4. The method of claim 2, wherein the substrate has N type dopants and the well region has P type dopants.

5. The method of claim 1, wherein the substrate has P type dopants and the well region has N type dopants.

6. The method of claim 1, wherein the substrate has N type dopants and the well region has type dopants.

7. A method of reducing the capacitance of a conductive layer, comprising:

providing a substrate having an isolation, wherein a dielectric layer is formed on the substrate and a conductive layer is formed on the dielectric layer; and forming a multi-well region below and adjacent to the isolation of the substrate, wherein the multi-well region has a different type of dopant than a dopant type of the substrate and is in a floating form.

8. The method of claim 7, further comprising forming a local interconnection on the isolation.

9. The method of claim 8, wherein the multi-well comprises at least a first well region and a second well region, with the first well region being adjacent to the substrate and including the second well region therein, and the first well region having a different dopant type than the dopant type of the substrate and the second well region.

10. The method of claim 9, wherein the dopant type of the substrate and the second well region is P type, and that of the well region is N type.

11. The method of claim 9, wherein the dopant type of the substrate and the second well region N type, and that of the well region is P type.

12. The method of claim 7, wherein the multi-well region comprises at least a first well region and a second well region, with the first well region being next to the substrate and the second well region being inside the first well region, and the first well region a different dopant type than the dopant type of the substrate and the second well region.

13. The method of claim 12, wherein the dopant type of the substrate and the second well region is P type, and that of the well region is N type.

14. The method of claim 12, wherein the dopant type of the substrate and the second well region is N type, and that of the well region is P type.

15. A semiconductor device having a reduced-capacitance conductive layer, comprising:

a substrate having an isolation;

a dielectric layer covering the substrate and the isolation, a conductive layer on the dielectric layer above the isolation, a well region below and adjacent to the isolation of the substrate, wherein the well region has a different type of dopant than a dopant type of the substrate and is in a floating form.

16. The semiconductor device of claim 15, wherein the isolation has a local interconnection thereon.

17. The semiconductor device of claim 15, wherein the substrate has P type dopants and the well region has N type dopants.

18. The semiconductor device of claim 15, wherein the substrate has N type dopants and the well region has P type dopants.

19. A semiconductor device having a reduced-capacitance conductive layer, comprising:

a substrate having an isolation;

a dielectric layer covering the substrate and the isolation;

a conductive layer on the dielectric layer above the isolation;

a multi-well region below and adjacent to the isolation of the substrate, wherein the multi-well region has a different type of dopant than a dopant type of the substrate and is in a floating form.

20. The semiconductor device of claim 19, wherein the isolation has a local interconnection thereon.

21. The semiconductor device of claim 19, wherein the multi-well comprises at least a first well region and a second well region, with the first well region being adjacent to the substrate and including the second well region therein, and the first well region having a different dopant type than the dopant type of the substrate and the second well region.

22. The semiconductor device of claim 21, wherein the dopant type of the substrate and the second well region is P type, and that of the well region is N type.

23. The semiconductor device of claim 21, wherein the dopant type of the substrate and the second well region is N type, and that of the well region is P type.

* * * * *